(12) United States Patent
Belouet

(10) Patent No.: US 6,649,570 B2
(45) Date of Patent: Nov. 18, 2003

US006649570B2

(54) BUFFER LAYER STRUCTURE BASED ON DOPED CERIA FOR PROVIDING OPTIMIZED LATTICE MATCH WITH A YBCO LAYER IN A CONDUCTOR

(75) Inventor: Christian Belouet, Sceaux (FR)

(73) Assignee: Nexans, Paris (FR)

( * ) Notice: Subject to any disclaimer, the term of this patent is extended or adjusted under 35 U.S.C. 154(b) by 0 days.

(21) Appl. No.: 09/970,790

(22) Filed: Oct. 5, 2001

(65) Prior Publication Data

US 2002/0041973 A1 Apr. 11, 2002

(30) Foreign Application Priority Data

Oct. 9, 2000 (EP) .............................. 00402774

(51) Int. Cl.$^7$ .......................... H01B 12/00; H01F 6/00; H01L 39/00
(52) U.S. Cl. ................. 505/237; 505/238; 428/701; 428/702; 428/430; 174/125.1
(58) Field of Search ................. 428/690, 701, 428/698, 697, 702, 930; 505/237, 238; 174/125.1

(56) References Cited

U.S. PATENT DOCUMENTS

| 5,262,394 A | * | 11/1993 | Wu et al. ................. 428/457 |
| 5,595,960 A |   | 1/1997  | Belouet et al. |
| 5,741,377 A | * | 4/1998  | Goyal et al. ............... 148/512 |
| 5,872,080 A | * | 2/1999  | Arendt et al. ............. 428/469 |
| 5,958,599 A | * | 9/1999  | Goyal et al. ............... 428/457 |
| 5,968,877 A | * | 10/1999 | Budai et al. ................ 117/86 |
| 5,972,847 A |   | 10/1999 | Feenstra et al. |
| 6,022,832 A | * | 2/2000  | Fritzemeier et al. ....... 117/102 |
| 6,051,846 A | * | 4/2000  | Burns et al. ................ 257/31 |
| 6,077,344 A |   | 6/2000  | Shoup et al. |
| 6,150,034 A |   | 11/2000 | Paranthaman et al. |

OTHER PUBLICATIONS

D. Selbmann et al, "Structural properties of epitaxial YSZ and doped Ce02 films on different substrates prepared by liquid sources MOCVD (LSMOCVD)", Journal De Physique IV, vol. 10, No. 2 Feb. 2000, pp. 27–33, XP00099156.

A Khodan et al, "Zr02—Ce02 and Ce02—La203 film grown on oxide substrates and their applications in oxide heterostructures", Journal of Crystal Growth, vol. 209, No. 4, Feb. 2000, pp. 828–841, XP004198409.

D. Chambonnet et al, "Control of the 2D/3D transition of the growth mechanism in the YBCO/Ce1−xLax02−x/2/SRTi03 system", Physica C, vol. 302, No. 2–3, Jun. 1998 pp. 198–206, XP004149175.

* cited by examiner

*Primary Examiner*—Tom Dunn
*Assistant Examiner*—Colleen P. Cooke
(74) *Attorney, Agent, or Firm*—Sughrue Mion, PLLC

(57) ABSTRACT

A buffer layer structure based on doped ceria for providing optimized lattice match with a YBCO layer in a conductor, a lattice matching layer for use in said structure and process of manufacturing thereof. Said buffer layer comprises a $CeO_2$ layer doped with a dopant, and has a superconductive layer of YBCO on said $CeO_2$ layer. The invention is characterized in that the $CeO_2$ layer is a lattice matching layer.

8 Claims, No Drawings

BUFFER LAYER STRUCTURE BASED ON DOPED CERIA FOR PROVIDING OPTIMIZED LATTICE MATCH WITH A YBCO LAYER IN A CONDUCTOR

The present invention relates to the field of superconductivity. More particularly the invention relates to a buffer layer structure based on doped ceria for providing optimized lattice match with a YBCO layer in a conductor, a lattice matching layer to be included in said buffer layer structure and a process of manufacturing thereof. The solution proposed by the present invention, minimizes the lattice mismatch problems between YBCO and the underlying layer during the deposition process. This makes it possible to obtain relatively higher current density values, thus improving the current transport features of the tape conductor.

BACKGROUND OF THE INVENTION

Ceria is $CeO_2$ (cerium oxide), which is a known material to be used as a buffer layer in superconducting thin film technology. YBCO stands for Yttrium Barium Copper Oxide with the chemical formula of: $YBa_2Cu_3O_7$. YBCO is a superconducting ceramic. A superconducting ceramic like YBCO has the property of conducting large DC electrical current densities (up to several $MA/cm^2$ at temperatures $\leq 77K$., and in a zero applied magnetic field) with zero resistance—and large AC current densities with negligible resistance, as compared with metals, up to high frequencies (beyond 1 GHz).

As it is known in the related art, a superconductive tape is generally configured as a multilayer structure comprising a bi-axially textured substrate over which or one or more epitaxial buffer layers are deposited. The bi-axially textured substrate can be either a bi-axially textured Ni substrate, as in the RABiTS process [see C. Park, et al., IEEE Transactions Applied Superconductivity Vol.9, n° 2 (1999) 2276–2279], or a Ni-based alloy, coated by a bi-axially textured oxide layer, e.g. YSZ (Yttrium stabilized zirconia) bi-axially textured by the IBAD process [Y. Iijima, et al, Applied Physics Letters 60 (1992) 769]. IBAD stands for Ion Beam Assisted Deposition.

The buffer layer itself is actually made of several layers, each layer having a specific role, such as diffusion barrier against Ni, bi-axial texturing when the metallic substrate is a polycrystalline Ni alloy, and lattice matching with the YBCO layer. Some examples of such buffer layers are YSZ and ceria, often used as a lattice matching layer. The YBCO layer is then deposited over said buffer layers. One of the important factors in determining the quality of a superconductive structure is the so called current density, $J_c$, which is measured as a function of electric current per $cm^2$ at a standard temperature. Current values for $J_c$ measured on YBCO tape conductors are of the order of several $10^5/cm^2$ at 77K. Therefore, any improvement in the current density value would improve the current carrying capacity of the tape conductors.

However, in order to obtain higher current density ($J_c$) values, one is faced with certain problems in the manufacturing process.

One of such problems is the difficulty in achieving bi-axially textured YBCO layers, of at least 1 μm thickness, capable of exhibiting $J_c$ values above $10^6$ $A/cm^2$ at 77K. These properties can only be achieved if firstly the YBCO layer is bi-axially textured and secondly, if the bi-dimensional growth of YBCO is maintained over hundreds of nanometers, which is not the case with current lattice matching layers such as Y2O3, pure $CeO_2$ or YSZ. The optimal bi-axial texture of the YBCO layer is specified by grains with their c-axis perpendicular to the surface of the layer and an in-plane crystalline misorientation between grains which is substantially below 10°.

A further requirement is that the surface coverage of the texture by grains with an a-axis perpendicular to the film plane should be below 1 percent. This is achieved by adjusting the deposition temperature of the YBCO layer in a narrow window, e.g. centered about 765° C. in the case of Pulsed Laser-assisted Deposition [see D. Chambonnet, et al., Physica C 235–240, (1994) 625–626].

In the above requirements, bi-dimensional growth means growth without screw dislocations perpendicular to the surface of the layer. The onset of screw dislocation occurs because of the lattice mismatch between YBCO and the buffer layer, the density of screw dislocations increasing with the lattice mismatch. The lattice mismatch is defined as the relative difference in lattice parameters between two epilayers. In the case of YBCO and ceria, at the YBCO deposition temperature, the lattice parameters of YBCO and ceria are 0.3889 nm and 0.3859 nm respectively. The lattice mismatch is the following ratio: $(0.3889-0.3859)/0.3889 = 7.7 \times 10^{-3}$.

As soon as screw dislocations appear, due to elastic strain relaxation, grain growth is driven by screw dislocations. This results in a so-called terrace growth morphology, with an increasingly rough surface as the film thickness increases.

Moreover, the size of the metallurgical grains being in close relationship with the density of screw dislocations, this implies that the lateral size of the metallurgical grains decreases as the density of screw dislocations increases. A net consequence is that the crystalline disorder increases at grain boundaries. This results in reduced transport properties at grain boundaries, i.e. lower $J_c$ values. Moreover, the disorder at grain boundaries and the surface roughness favor the penetration of magnetic vortices, which are responsible for electrical losses, in the YBCO layer. Thus, $J_c$ becomes very sensitive to self or external applied magnetic fields.

As discussed above, the buffer layers conventionally used are YSZ or $CeO_2$. However, the use of these layers as such gives rise to the drawback that at a typical deposition temperature, such as for example 765° C., the relative mismatch between these materials and YBCO is too large, namely in the range of about 5% for YSZ/YBCO and 0.8% for $CeO_2$/YBCO. In the best of these two cases, the onset of screw dislocations arises at a critical thickness ($t_c$) of around 100 nm, whereas as discussed above, the desired $t_c$ value should be in the range of several hundred nanometers in order to grow high quality thick YBCO films.

It is therefore desired to use a buffer layer in a conductor structure such that the relative mismatch produced by said buffer layer at a normal deposition temperature, e.g. at about 765° C., is substantially below 0.1%. This lattice mismatch barrier yields an expectation of $t_c$ values of several hundred nanometers, e.g. 300 nm for 0.1%.

DESCRIPTION OF THE INVENTION

In order to overcome the above drawbacks, the buffer layer structure based on doped ceria for YBCO tape conductors, a lattice matching layer to be included in said buffer layer and a process of manufacturing thereof, objects of the present invention are proposed.

According to the invention, the use of a dopant, which maintains the fluorite crystalline structure of ceria up to a large volume fraction, can cause a substantial change in the lattice parameter of the compound. The partial substitution of Ce by the dopant (La for instance) results in a compound, which eventually maintains the crystalline symmetry of the host (ceria), up to a large atomic fraction, and exhibits a lattice parameter which varies with the dopant concentration. In the case of La-doped ceria, the lattice parameter linearly varies with the atomic concentration of the dopant (known as the Vegard's law), up to an atomic fraction of 0.55 [see B. C. Morris, et al., J. Mater. Chem. 10 (1993) 1007]. Several dopants are known to have such property, such as lanthanum (La), calcium (Ca), magnesium (Mg), chromium (Cr), europium (Eu), iron (Fe), hafnium (Hf), manganese (Mn) and neodymium (Nd).

Accordingly, one object of the present invention is that of providing a conductor structure comprising a metallic substrate tape over which there is provided at least one buffer layer comprising a $CeO_2$ layer doped with a dopant, and having a superconductive layer of YBCO on said $CeO_2$ layer characterized in that said $CeO_2$ layer is a lattice matching layer.

According to another aspect of the present invention, the metallic substrate is selected so as to have a thermal expansion coefficient $\alpha$ close to that of YBCO, namely in the range of $-200-800°$ C.

According to still a further aspect of the present invention, the $CeO_2$ lattice matching layer may have a thickness substantially inferior or equal to 100 nm and the YBCO layer may have a thickness substantially superior or equal to 1 $\mu$m.

In a preferred embodiment according the invention, the buffer layer comprises between the substrate and the $CeO_2$ lattice matching layer a first layer, being a diffusion barrier against the substrate metal. And this first layer may be a $SiN_x$ layer having a thickness comprised between 10 nm and 100 nm.

Furthermore, in this embodiment, the buffer layer comprises between the first layer and the lattice matching layer a second layer which is bi-axially textured for transferring its texture to the YBCO layer at a proper deposition temperature. And this second layer may be a MgO layer, having a thickness substantially inferior or equal to 10 nm.

In one embodiment according the invention, the metallic substrate is a Ni alloy.

In another embodiment according the invention, the metallic substrate is a biaxially textured Ni substrate.

According to an aspect of the present invention the dopant is lanthanum. And said lanthanum may have an atomic fraction substantially equal to 0,15.

Another object of the present invention is that of providing a method of manufacturing a conductor structure previously described characterized in that it comprises:

a depositing step by PVD of the lattice matching layer of $CeO_2$ doped on a substrate layer;

a depositing step of the superconductive layer of YBCO on the $CeO_2$ lattice matching layer.

According to another aspect of the present invention, the method may comprise a depositing step by PECVD or PVD of the first layer on the metallic substrate.

More over, the method may comprise a depositing step by PVD with IBAD of the second layer on the first layer, the substrate layer being the second layer.

These and further features of the present invention are described in more detail herein below, in the description of a preferred embodiment as well as in the claims.

EXAMPLE OF A PREFERRED EMBODIMENT

As stated above, the solution proposed by the present invention relates to the use of a buffer layer comprising $CeO_2$ lattice matching layer which is doped with a dopant. As a result, the lattice parameter of this $CeO_2$ layer is changed so as to reduce the relative lattice mismatch with the YBCO layer. There are several dopants which provide the desired effect. La is one such dopant which is mentioned herein as mere example and is not to be construed as to limit the scope of the present invention.

In the case of La, the compound $Ce_{(1-x)} La_x O_{2-x/2}$ has shown in practice to provide an estimated relative lattice mismatch with YBCO of 0.1% for x=0.15. However, experiments show that further refinement of this formulation, by classical means, would result in lower lattice mismatch values.

It is to be noted that the overall solution proposed herein must take certain constraints of YBCO tape conductors into account, in addition to the one already mentioned related to the lattice mismatch. These constraints include the following criteria:

1—Compatibility of the thermal expansion of YBCO with respect to the Ni-based substrate.

2—A buffer layer bi-axially textured in order to yield an in-plane misorientation $\phi$ FWHM(°) (Full Width Half Maximum) significantly below 10°, which is a necessary but not sufficient condition to obtain $J_c$ values above $10^6$ A/cm$^2$ [see D. Dimos, et al., Phys. Rev. B, vol.41, (1990) 4038–4049]. The buffer layer must act also as a barrier against diffusion of the substrate metal into YBCO.

Having the above constraints in mind, the following process is proposed by the present invention:

A substrate material is selected, for example a Ni alloy would be suitable selection. Said substrate material is to be optimized, inter alia, in relation to its thermal expansion coefficient $\alpha$ so as to reach values for $\alpha$ close to that of YBCO in the range of $-200-800°$ C. Examples of suitable candidate Ni alloys are Haynes B ($\alpha=12.8\times10^{-6}$ K$^{-1}$), Haynes 242 ($\alpha=13.9\times10^{-6}$ K$^{-1}$), Hastelloys, Inconel 625, etc., which have $\alpha$ values comparable with that of YBCO ($13.1\times10^{-6}$ K$^{-1}$).

A bi-axially textured Ni substrate, such as prepared by the above-mentioned RABiTS process can also be used. The problem of the lattice matching layer with YBCO is the same in this particular approach.

Preferably, the buffer layer may in turn comprise three stacked and relatively thin layers, each of which having a specific function.

The first one of these layers is a diffusion barrier against the substrate metal. For example in the case of a Ni or Ni alloy metallic substrate, a nitride material may be used, such as $SiN_x$ deposited by for example PVD (Physical Vapor Deposition) or PECVD (Plasma Enhanced Vapor Deposition).

A second bi-axially textured layer, which provides the texture of the YBCO film at the proper deposition temperature, e.g. 740–770° C. The material used for this layer can be for example a MgO layer, deposited by for example PVD, e-beam evaporation, PLD (Pulsed Laser-assisted Deposition) or ion beam sputtering, and simultaneously textured by IBAD (Ion Beam Assisted Deposition) technique which is well-known in the related art.

Finally, the $CeO_2$ lattice matching layer which is doped with a dopant such as for example La, is the top layer for lattice matching. This layer may be deposited by PVD.

The methods corresponding to the growth of each of the above layers may be any of the known sputtering methods used in the related art.

With the above procedure, and using the proposed materials, a YBCO tape 1 μm thick and above can be obtained having a current density $J_c$ value of above $10^6$ A/cm$^2$ at 77K., 0T and providing a substantially better resistance to external magnetic fields. This advantageous result is due to the improved connectivity between metallurgical grains on the one hand, and the improved surface smoothness on the other hand.

Another advantage of the solution proposed by the present invention is that a buffer layer made up of sub-layers tailored for each function of the buffer layer is more efficient, and eventually easier to control in a manufacturing process. This fact brings about a further advantage that the thickness of each layer can be minimized. Whilst the typical values for a bi-axially textured YSZ layer used conventionally is above 1000 nm, in order to reach φ FXHM(°)≈100, the diffusion barrier and the doped CeO$_2$ layer have typical thickness values substantially inferior or equal to 100 nm and preferably between 10 to 100 nm, and the bi-axially textured MgO layer has typical thickness value substantially inferior or equal to 10 nm.

Still another advantage associated with the use of a perfect lattice matched layer at the deposition temperature of YBCO is that YBCO films with a high crystalline quality not only provide a high $J_c$ value, with a high resistance to magnetic field penetration, but also a relatively higher resistance to the environment.

What is claimed is:

1. A conductor structure comprising:
   a metallic substrate tape over which there is provided at least one buffer layer comprising a CeO2 layer doped with a dopant, and having a superconductive layer of YBCO on said CeO2 layer,
   wherein said at least one buffer layer comprises:
   said doped CeO2 layer which is a lattice matching layer,
   a first layer, between said metallic substrate and said lattice matching layer, being a diffusion barrier against said metallic substrate, and
   a second layer, between said first layer and said lattice matching layer, which is bi-axially textured for transferring its texture to said YBCO layer at a proper deposition temperature, said second layer being an MgO layer having a thickness substantially less than or equal to 10 nm,
   wherein said YBCO layer has a thickness substantially more than or equal to 1 μm and exhibits high current density values.

2. A conductor structure according claim 1, wherein said metallic substrate is selected so as to have a thermal expansion coefficient α close to that of YBCO, namely −200–800° C.

3. A conductor structure according to claim 1, wherein said CeO2 lattice matching layer has a thickness substantially less than or equal to 100 nm.

4. A conductor structure according to claim 1, wherein said first layer is a nitride material having a thickness of 10 nm to 100 nm.

5. A conductor structure according to claim 1, wherein said metallic substrate is a Ni alloy.

6. A conductor structure according to claim 1, wherein said metallic substrate is a biaxially textured Ni substrate.

7. A conductor structure according to claim 1, wherein said dopant is lanthanum.

8. A conductor structure according to claim 7, wherein said lanthanum has an atomic fraction substantially equal to 0.15.

* * * * *